(12) United States Patent
Shadwell

(10) Patent No.: US 7,187,248 B2
(45) Date of Patent: Mar. 6, 2007

(54) DIFFERENTIAL OSCILLATOR HAVING TWO SIDES, AN INTEGRATED CIRCUIT INCLUDING THE DIFFERENTIAL OSCILLATOR, A MOBILE TELEPHONE INCLUDING THE DIFFERENTIAL OSCILLATOR, AND METHOD OF OPERATING THE DIFFERENTIAL OSCILLATOR

(75) Inventor: Peter Wardlow Shadwell, Tadley (GB)

(73) Assignee: Sony United Kingdom Limited, Weybridge (GB)

( * ) Notice: Subject to any disclaimer, the term of this patent is extended or adjusted under 35 U.S.C. 154(b) by 70 days.

(21) Appl. No.: 11/059,855

(22) Filed: Feb. 17, 2005

(65) Prior Publication Data
US 2005/0179503 A1   Aug. 18, 2005

(30) Foreign Application Priority Data
Feb. 18, 2004   (GB)   ................. 0403609.1

(51) Int. Cl.
*H03L 7/099* (2006.01)
(52) U.S. Cl. ................. 331/185; 331/117 R; 327/266; 327/274; 327/287

(58) Field of Classification Search ................. 331/185, 331/117 R; 327/266, 274, 287
See application file for complete search history.

(56) References Cited

U.S. PATENT DOCUMENTS

| 5,396,195 | A | 3/1995 | Gabara |
| 6,064,277 | A * | 5/2000 | Gilbert ................. 331/117 R |
| 6,867,658 | B1 * | 3/2005 | Sibrai et al. ................. 331/185 |

OTHER PUBLICATIONS

Kral A et al.: "RF-CMOS oscillators with switched tuning" May 11, 1998, Custom Integrated Circuits Conference, 1998. Proceedings of the IEEE 1998 Santa Clara, CA, USA May 11-14, 1998, New York, NY, USA,IEEE, US, pp. 555-558, XP010293959 ISBN: 0-7803-4292-5.

* cited by examiner

*Primary Examiner*—Robert Pascal
*Assistant Examiner*—Levi Gannon
(74) *Attorney, Agent, or Firm*—Oblon, Spivak, McClelland, Maier & Neustadt, P.C.

(57) ABSTRACT

A differential oscillator circuit, including an oscillator having a first side and a second side and bias circuitry for applying a bias voltage to the first and second sides of the oscillator wherein the bias circuitry is arranged such that, upon start-up, the bias voltage is not applied to the second side of the oscillator until after the first side of the oscillator by a delay period.

21 Claims, 5 Drawing Sheets

DIFFERENTIAL OSCILLATOR HAVING TWO SIDES, AN INTEGRATED CIRCUIT INCLUDING THE DIFFERENTIAL OSCILLATOR, A MOBILE TELEPHONE INCLUDING THE DIFFERENTIAL OSCILLATOR, AND METHOD OF OPERATING THE DIFFERENTIAL OSCILLATOR

BACKGROUND OF THE INVENTION

1. Field of the Invention

The present invention relates to a differential oscillator circuit and a method of starting up such a circuit.

2. Description of the Related Art

Differential oscillator circuits, such as that illustrated in FIG. 1 of the accompanying drawings, have been proposed for use in devices such as mobile telephones.

The circuit is symmetric about an oscillator 2 so as to provide a bias voltage to either side of the oscillator 2. A bias control line 4 is operable to turn the circuit on and off. In particular, the two halves of the bias circuitry are connected by a common line 6 which is operative to turn on the bias to both sides of the oscillator 2.

Once the bias has been applied to the oscillator 2, any noise in the circuit will start oscillation of the oscillator 2 and then oscillations will build up to the required steady-state.

U.S. Pat. No. 5,982,246 proposes a fast start-up oscillator. However, this does not have the advantages of a differential oscillator and, furthermore, relies upon pre-stressing a piezoelectric resonator with a DC bias voltage.

OBJECTS OF THE INVENTION

It is an object of the present invention to allow fast start-up of a differential oscillator.

SUMMARY OF THE INVENTION

According to the present invention, there is provided a method of starting up a differential oscillator circuit having bias circuitry for applying a bias voltage to first and second sides of an oscillator. The method includes applying the bias voltage to the second side of the oscillator after the first side of the oscillator by a delay period.

According to the present invention, there is also provided a differential oscillator circuit. The circuit includes an oscillator having a first side and a second side and bias circuitry for applying a bias voltage to the first and second sides of the oscillator. The bias circuitry is arranged such that, upon start-up, the bias voltage is not applied to the second side of the oscillator until after the first side of the oscillator by a delay period.

In this way, the oscillator is deliberately unbalanced at the power enable stage. By providing a large unsymmetrical bias across the oscillator, the oscillator is given a push which means that a stable operating amplitude is achieved more quickly than when relying on random voltage artifacts.

The bias circuitry has a generally symmetric form. However, by virtue of the present invention, this is controlled to provide the oscillator bias voltage to one side of the oscillator in advance of the other side. There is no intention of applying significant pre-stressing to the oscillator, but only to cause a natural asymmetric disturbance to start the oscillating as soon as possible.

In many oscillator circuit applications, such as with TDMA (time division multiple access) circuits, it is desirable to be able to turn an oscillator circuit on and off very rapidly. For instance, in mobile telephone devices, in order to conserve battery power, it is desirable to keep an oscillator circuit turned off apart from in the active time slots of the TDMA. Since the time slots have relatively short periods, it is very important that the oscillator circuit can be brought up to stable operating amplitude as quickly as possible. With the present invention, this becomes possible.

Preferably, the bias circuitry is divided into two halves, a first half for applying the bias voltage to the first side of the oscillator and a second half for applying the bias voltage to the second side of the oscillator.

This corresponds to the general form of a differential oscillator in which both halves apply bias voltage to respective sides of the oscillator simultaneously. With the present invention, the two halves operate to start-up one after the other.

Preferably, the differential operating circuit further includes control circuitry arranged to cause the second half to apply the bias voltage to the second side of the oscillator only after the first half has been applying the bias voltage to the first side of the oscillator for the delay period.

In this way, the unsymmetrical bias is provided upon start-up so as to encourage the oscillator to reach its stable operating amplitude more quickly.

Preferably, the bias circuitry includes a switch arrangement for selectively connecting the first half and the second half, such that, when the first half applies the bias voltage to the first side of the oscillator and the switch arrangement connects the first half to the second half, the switch arrangement causes the second half to apply the bias voltage to the second side of the oscillator.

The two halves of a differential oscillator would normally be connected together in such a manner that, when the first half applies the bias voltage to the oscillator, the second half naturally follows the first half.

By providing the switch arrangement to selectively isolate the second half from the first half, it is possible to control the first half to apply the bias voltage to the oscillator, whilst isolating the second half and preventing the second half from applying the bias voltage to the oscillator. In this way, the second half can be controlled to start applying the bias voltage to the oscillator after the first half has already been applying the bias voltage to the oscillator for the delay period.

Preferably, the differential oscillator circuit further includes a delay circuit for controlling the switch arrangement to connect the first half to the second half after the first half applies the bias voltage to the second side of the oscillator by the delay period.

In this way, the delay circuit is used to control the switch arrangement.

With this arrangement, a bias control line can be provided connected to the first half for carrying a signal to which the first and second halves are responsive to apply the bias voltage to the first and second sides of the oscillator respectively, the switch arrangement selectively isolating the second half from the bias control line.

In this way, it is only necessary to apply one control to the bias circuitry to turn on the oscillator, the switching arrangement providing the necessary delay required by the present invention.

Of course, the delay circuit could be used in any other manner for controlling the bias circuitry to delay applying the bias voltage to the second side of the oscillator until after the first side of the oscillator by the delay period.

The delay circuit could be used directly to link the first and second halves. Alternatively, the first and second halves could be controlled independently with the delay circuit forming part of that control.

The present invention is applicable to many types of oscillator within the differential oscillator circuit, for instance a tank circuit or a crystal oscillator.

In order to allow very fast start-up, it is proposed that the delay period should not be too great. The delay period must be of sufficient duration to allow the bias levels in the half of the oscillator enabled first to reach the quiescent DC level. This delay depends on the particular circuit topology employed and the values of the components used. To all intents and purposes, a very short delay would have both halves biasing-up simultaneously.

It will be appreciated that the delay period is an intended delay produced intentionally by the circuitry and not merely an effect caused by the tolerances and switching rates of the various components in the circuitry. The delay period could be as short as possible whilst still achieving the desired effect.

Preferably, the delay period is between 1 nano-second and 1 micro-second, in particular in the region of 500 nano-seconds. This is particularly useful for an oscillator having a period in the region of 38 nano-seconds.

The delay period is preferably greater than the oscillator. In particular, the delay period can be of the order of 10 times the oscillator period.

As noted above, it is not necessary for the start-up unsymmetrical bias of the present invention to form significant pre-stressing of the oscillator. Thus, in certain situations, it may be desirable for the first and second sides of the oscillator to be connected to the bias circuitry by respective first and second capacitors so as to prevent DC stressing of the oscillator.

According to the present invention, there is also provided an integrated circuit including a differential oscillator circuit as defined above. The integrated circuit can be an integrated circuit for use as one of the chip set of a mobile telephone, for instance a transmitter and/or receiver integrated circuit.

Similarly, according to the present invention, there is also provided a mobile telephone including a differential oscillator circuit as defined above or an integrated circuit as defined above.

DETAILED DESCRIPTION OF THE PREFERRED EMBODIMENTS

The invention will be more clearly understood from the following description, given by way of example only, with reference to the accompanying drawings.

The present invention will first be described with reference to an embodiment based on the differential oscillator of FIG. 1.

Figure 2:
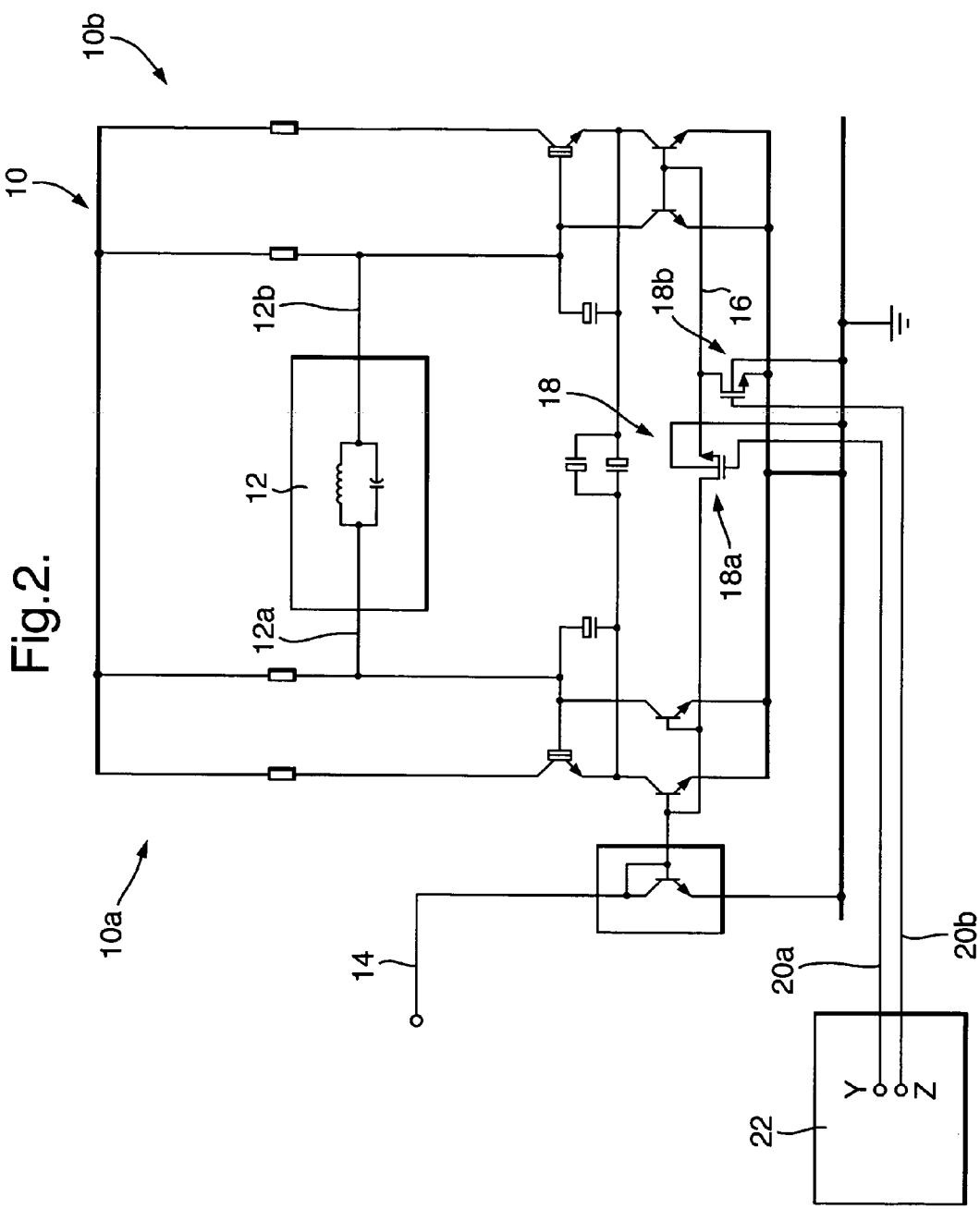
FIG. 2 illustrates a differential oscillator circuit embodying the present invention.

Referring to FIG. 2, it will be seen that the differential oscillator comprises bias circuitry 10 for applying an appropriate bias voltage to either side of an oscillator 12. In accordance with differential oscillator design, the bias circuitry 10 is generally symmetric either side of the oscillator 12 in such a manner as to allow the oscillator 12 to oscillate as required. The bias circuitry can thus be considered as comprising a first half 10a on one side of the oscillator 12 and a second half 10b on the other side of the oscillator 12. In particular, the first half 10a is connected to a first side 12a of the oscillator 12 and the second side 10b is connected to a second side 12b of the oscillator 12.

As illustrated, the oscillator 12 is embodied as a tank circuit. However, any form of an oscillator, such as a crystal oscillator, may be used.

Figure 1:
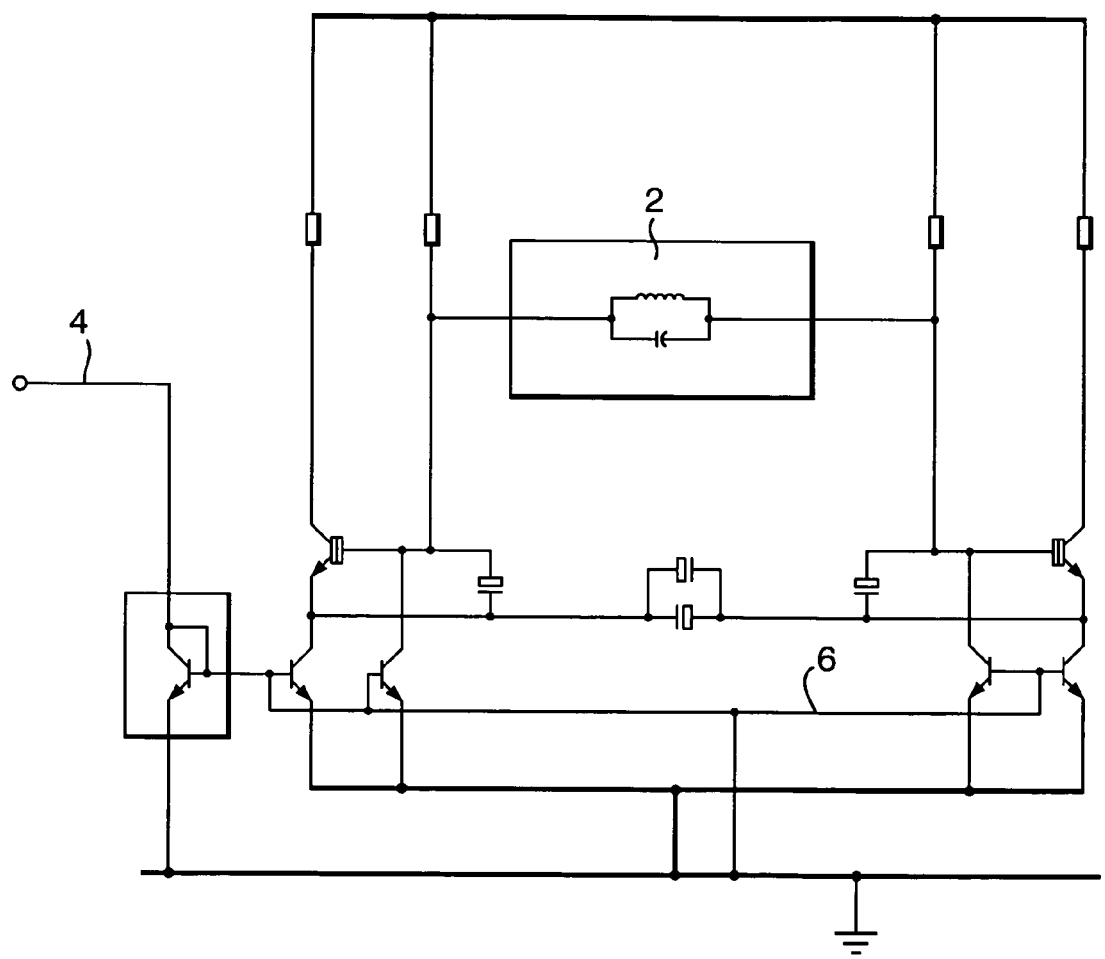
FIG. 1 illustrates a differential oscillator circuit.

As with the arrangement of FIG. 1, a bias control line 14 is connected to the bias circuitry 10. The bias control line 14 is used to carry a signal to control the differential oscillator. In particular, in response to the signal on the bias control line 14, the bias circuitry 10 provides the appropriate bias to the oscillator 12. The particular components of the bias circuitry 10 illustrated in FIG. 2 may be arranged in a known manner to do this and will be understood by the skilled reader.

As with the arrangement of FIG. 1, a line 16 connects the first half 10a of the bias circuitry to the second half 10b of the bias circuitry. However, in contrast to the arrangement of FIG. 1, the embodiment illustrated in FIG. 2 includes a switch arrangement 18 which is controllable to selectively provide a break in the line 16 so as to disconnect the second half 10b from the first half 10a.

The switch arrangement 18 may be embodied in any suitable manner according to the overall circuit design of the bias circuitry. However, as illustrated, the switching arrangement 18 includes two transistors, namely a main switching transistor 18a and a secondary earthing transistor 18b. The main switching transistor 18a is controllable to make or break a connection in the line 16. The secondary earthing transistor 18b is then provided to earth or connect to ground the line 16 on the side of the second half 10b when the main switching transistor 18a breaks the line 16 so as to disconnect the first half 10a from the second half 10b.

As illustrated, a pair of control lines 20a and 20b are provided respectively to control the main switching transistor 18a and the secondary earthing transistor 18b. In the illustrated embodiment, these control lines 20a and 20b carry respectively inverted control levels.

Considering now operation of the overall circuit, it will be appreciated that the switching arrangement 18 can be used to keep the second half 10b of the bias circuitry isolated from the first half 10a and the line 16 at ground. Thus, when the bias control line 14 is used to turn on the differential oscillator, only the first half 10a is activated to provide a bias to the oscillator 12. In this way, the first side 12a of the oscillator 12 is provided with the bias voltage, whereas the second side 12b of the oscillator 12 is kept at ground. By operating the switch arrangement 18 at a time following the switching on of the differential oscillator circuit of the control bias line 14, the line 16 on the second half side of the bias circuitry 10 controls the second half 10b of the bias circuitry 10 to provide the bias voltage to the second side 12b of the oscillator 12.

Switching of the switch arrangement 18 is arranged to take place at a time after the control bias line 14 activates the first half 10a of the bias circuitry 10, in particular after a delay period.

In this way, upon start-up, the bias circuitry provides a large unsymmetrical bias across the oscillator. In other words, at the time of power enable, the circuit is deliberately unbalanced so as to provide a push across the oscillator 12 which brings the oscillator 12 to a stable operating amplitude more quickly than when relying on random circuit noise.

In the embodiment illustrated in FIG. 2, the switch arrangement is controlled by means of a delay circuit 22 connected to the control lines 20a and 20b.

The delay circuit 22 receives the signal of the bias control line 14 or an equivalent signal corresponding to it. Thus, when a signal is provided on the bias control line to start-up the differential oscillator, the delay circuit 22 is provided with a corresponding signal. However, the delay circuit 22 is arranged only to switch the switch arrangement after a delay period.

In a preferred embodiment, the delay circuit 22 can include a capacitive element across which a voltage ramps up after the signal is provided to start-up the differential oscillator. According to the time constant of the resistive/capacitive circuit, the voltage across the capacitive element will reach a threshold after a predetermined period. After this delay period, the delay circuit can be triggered by the voltage reaching the threshold so as to operate the switch arrangement 18.

As discussed above, the present invention is applicable to any differential oscillator.

Figure 3:
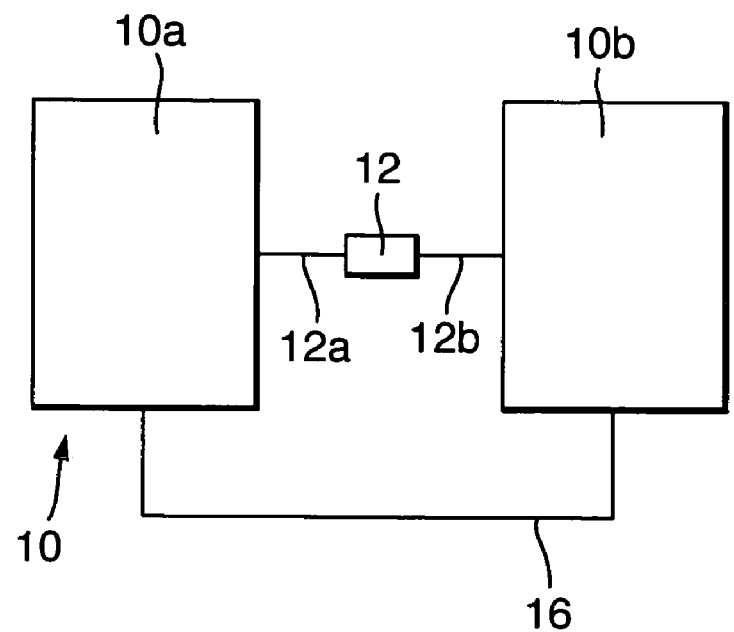
FIG. 3 illustrates schematically a differential oscillator circuit.

FIG. 3 illustrates schematically a differential oscillator having an oscillator 12 with a first side 12a connected to a first half 10a of bias circuitry 10 and a second side 12b connected to a second half 10b of bias circuitry 10. A line 16 joins the first half 10a to the second half 10b such that the two halves 10a, 10b of the bias circuitry work simultaneously.

Figure 4:
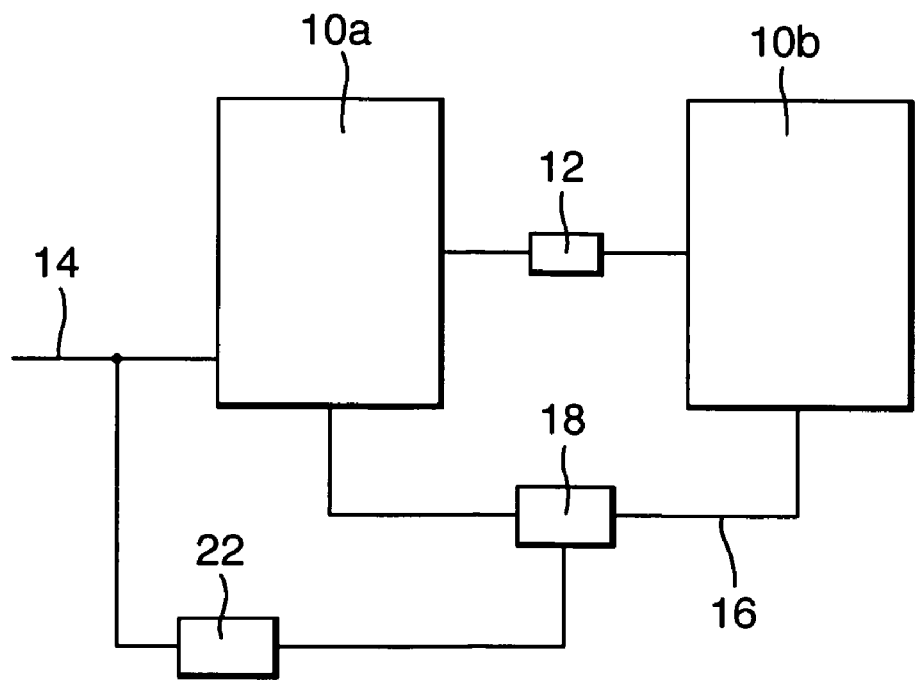
FIG. 4 illustrates schematically the differential oscillator circuit of FIG. 2.

FIG. 4 illustrates schematically an arrangement corresponding to that described with reference to FIG. 2.

A bias control line 14 is used to actuate a first half 10a of the bias circuitry and also a delay circuit 22. After the delay period, the delay circuit 22 operates the switch arrangement 18 to connect the first half 10a to the second half 10b by means of the line 16.

The same effect can be achieved with other similar arrangements.

Figure 5:
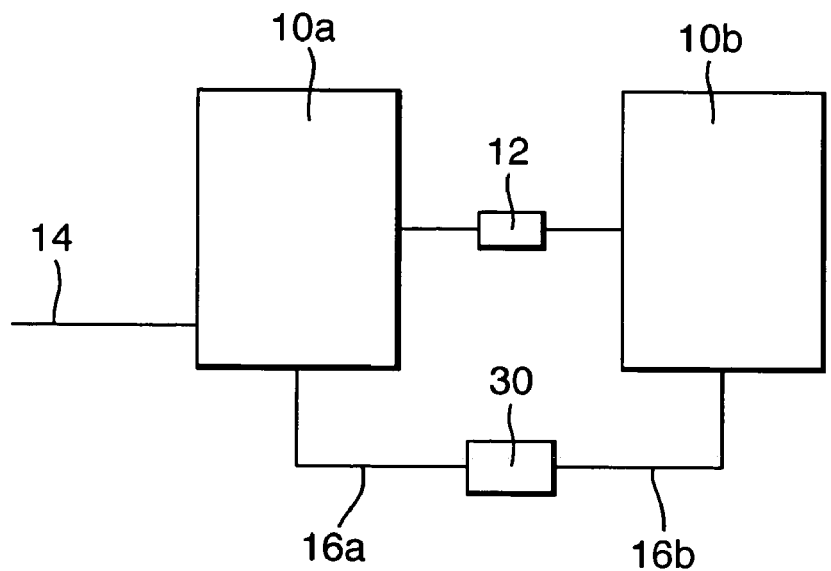
FIGS. 5 and 6 illustrate schematically alternative embodiments.

FIG. 5 illustrates an embodiment having a control circuit 30 which includes a switch arrangement and a delay circuit. The control circuit 30 responds to a change in potential on the line 16a on the side of the first half 10a and, after the delay period, allows the same potential to develop on the line 16b on the side of the second half 10b.

Figure 6:
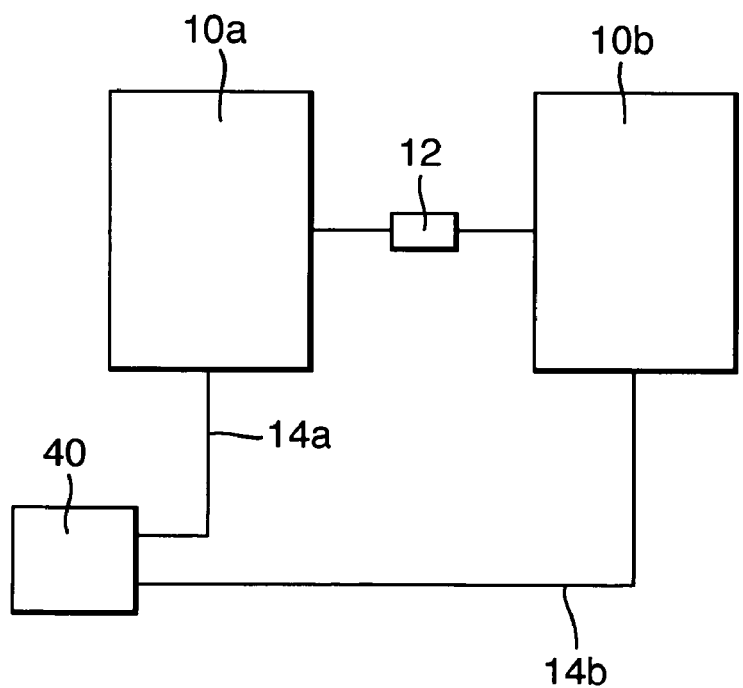

FIG. 6 illustrates an arrangement where the first half 10a of the bias circuitry is controlled in effect independently of the second half 10b of the bias circuitry. In particular, a control circuit 40 actuates a bias control line 14a for the first half and a bias control line 14b for the second half 10b. It will be appreciated that the control circuit 40 provides the required signal on the second bias control line 14b after a delay period from providing a signal on the first bias control line 14a.

In some applications, it may be desirable to isolate the oscillator 12 from DC effects.

Figure 7:
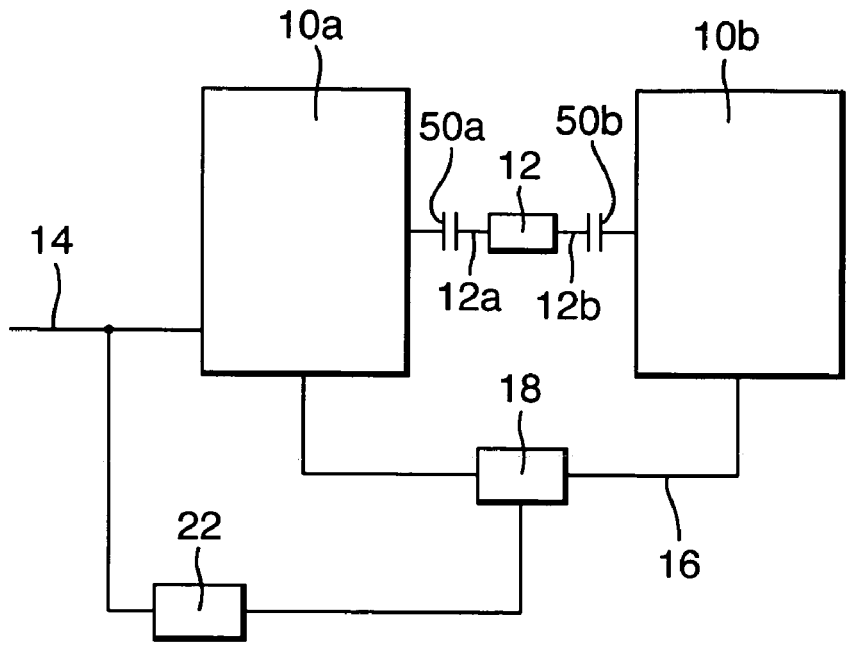
FIG. 7 illustrates capacitive isolation of an oscillator.

FIG. 7 illustrates an embodiment equivalent to those of FIGS. 2 and 4, but including a first capacitive element 50a connecting a first half 10a to the first side 12a of the oscillator 12 and a second capacitive element 50b connecting the second half 10b to the second side 12b of the oscillator 12.

The capacitive elements 50a and 50b prevent any DC biassing of the oscillator 12. They will allow the unsymmetrical bias to be applied during start-up whilst preventing any substantial pre-stressing of the oscillator 12.

The exact length of the delay period is not essential to the invention. The fact that there is a delay at all provides the unsymmetric bias and unbalancing to start oscillation. If the delay is too large, obviously the start-up time for the device is unnecessary extended. Clearly, if the delay becomes equal to the time taken by an "unassisted" oscillator to reach full oscillation amplitude, then there will be no benefit. The delay (max) value is difficult to quantify as it depends so much upon the exact circuitry employed.

For an embodiment having an oscillator period of 38 nano-seconds, it is preferred that the delay period is in the region of 500 nano-seconds, but delays between 1 nano-second and 1 micro-second could be considered. Preferably, the delay period is greater than the oscillator period, more preferably of the order of 10 times greater.

Figure 8:
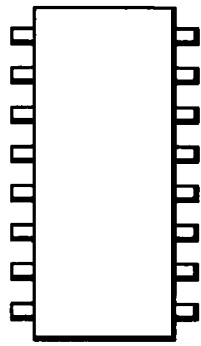
FIG. 8 illustrates an integrated circuit embodying the present invention.
Figure 9:
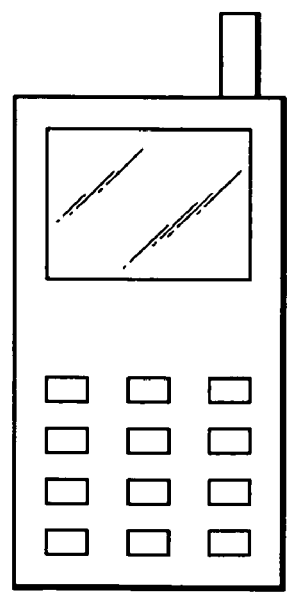
FIG. 9 illustrates a mobile telephone embodying the present invention.

It will be appreciated that the differential oscillator circuit can be embodied in an integrated circuit as illustrated in FIG. 8. Furthermore, the differential oscillator circuit or the integrated circuit can be embodied in a mobile telephone such as illustrated in FIG. 9.

I claim:

1. A differential oscillator circuit including:
   an oscillator having a first side and a second side;
   bias circuitry applying a bias voltage to the first and second sides of the oscillator;
   wherein:
      the bias circuitry is arranged such that, upon start-up, the bias voltage is not applied to the second side of the oscillator until after the first side of the oscillator by a delay period,
      the bias circuitry is divided into two halves, a first half applying the bias voltage to the first side of the oscillator and a second half applying the bias voltage to the second side of the oscillator, the differential oscillator circuit further including:
   control circuitry arranged to cause the second half to apply the bias voltage to the second side of the oscillator only after the first half has been applying the bias voltage to the first side of the oscillator for the delay period.

2. The differential oscillator circuit according to claim 1 wherein:
   the bias circuitry includes a switch arrangement selectively connecting the first half and the second half such that, when the first half applies the bias voltage to the first side of the oscillator and the switch arrangement connects the first half to the second half, the switch arrangement causes the second half to apply the bias voltage to the second side of the oscillator.

3. The differential oscillator circuit according to claim 2, wherein:
   the control circuitry includes a delay circuit controlling the switch arrangement to connect the first half to the second half after the first half applies the bias voltage to the first side of the oscillator by the delay period.

4. The differential oscillator circuit according to claim 3, further including:
   a bias control line connected to the first half carrying a signal to which the first and second halves are responsive to apply the bias voltage to the first and second side of the oscillator respectively, the switch arrangement selectively isolating the second half from the bias control line.

5. The differential oscillator circuit according to claim 2, further including:
a bias control line connected to the first half carrying a signal to which the first and second halves are responsive to apply the bias voltage to the first and second side of the oscillator respectively, the switch arrangement selectively isolating the second half from the bias control line.

6. The differential oscillator circuit according to claim 1, wherein the delay period is between 1 nano-second and 1 micro-second.

7. The differential oscillator circuit according to claim 6, wherein the delay period is in the region of 500 nano-seconds.

8. The differential oscillator circuit according to claim 1, wherein the period of the oscillator is in the region of 38 nano-seconds.

9. The differential oscillator circuit according to claim 1, wherein oscillator includes one of:
a tank circuit; and
a crystal oscillator.

10. The differential oscillator circuit according to claim 1, wherein the first and second sides of the oscillator are connected to the bias circuit by respective first and second capacitors so as to prevent DC stressing of the oscillator.

11. An integrated circuit including a differential oscillator circuit according to claim 1.

12. A mobile telephone including an integrated circuit according to claim 11.

13. A mobile telephone including a differential oscillator circuit according to claim 1.

14. A differential oscillator circuit including:
an oscillator having a first side and a second side; and
bias circuitry applying a bias voltage to the first and second sides of the oscillator;
wherein:
the bias circuitry is arranged such that, upon start-up, the bias voltage is not applied to the second side of the oscillator until after the first side of the oscillator by a delay period,
the bias circuitry is divided into two halves, a first half applying the bias voltage to the first side of the oscillator and a second half applying the bias voltage to the second side of the oscillator, and
the bias circuitry includes a switch arrangement selectively connecting the first half and the second half such that, when the first half applies the bias voltage to the first side of the oscillator and the switch arrangement connects the first half to the second half, the switch arrangement causes the second half to apply the bias voltage to the second side of the oscillator.

15. The differential oscillator circuit according to claim 14, further including:

a delay circuit controlling the switch arrangement to connect the first half to the second half after the first half applies the bias voltage to the first side of the oscillator by the delay period.

16. The differential oscillator circuit according to claim 15, further including:
a bias control line connected to the first half carrying a signal to which the first and second halves are responsive to apply the bias voltage to the first and second side of the oscillator respectively, the switch arrangement selectively isolating the second half from the bias control line.

17. The differential oscillator circuit according to claim 14, further including:
a bias control line connected to the first half carrying a signal to which the first and second halves are responsive to apply the bias voltage to the first and second side of the oscillator respectively, the switch arrangement selectively isolating the second half from the bias control line.

18. A differential oscillator circuit including:
an oscillator having a first side and a second side; and
bias circuitry applying a bias voltage to the first and second sides of the oscillator;
wherein:
the bias circuitry is arranged such that, upon start-up, the bias voltage is not applied to the second side of the oscillator until after the first side of the oscillator by a delay period, the differential oscillator circuit further including:
a delay circuit for controlling the bias circuitry to delay applying the bias voltage to the second side of the oscillator until after the first side of the oscillator by the delay period.

19. The differential oscillator circuit according to claim 18, wherein the delay period is between 1 nano-second and 1 micro-second.

20. The differential oscillator circuit according to claim 19, wherein the delay period is in the region of 500 nano-seconds.

21. A method of starting up a differential oscillator circuit having bias circuitry for applying a bias voltage to first and second sides of the differential oscillator, the method including:
initially applying the bias voltage asymmetrically to only the first side of the differential oscillator to begin said starting up; and
applying the bias voltage to the second side of the differential oscillator only after a delay period from the initial application of the bias voltage to only the first side of the differential oscillator to complete said starting up and quickly reach a stable operating amplitude for the differential oscillator.

* * * * *